United States Patent
Tang et al.

(10) Patent No.: US 9,906,201 B2
(45) Date of Patent: Feb. 27, 2018

(54) DYNAMICALLY DETECTING RESONATING FREQUENCIES OF RESONATING STRUCTURES

(71) Applicant: PRATT & WHITNEY CANADA CORP., Longueuil (CA)

(72) Inventors: Poi Loon Tang, Montreal (CA); Teuvo Saario, St-Amable (CA); Reza Pedrami, Montreal (CA)

(73) Assignee: PRATT & WHITNEY CANADA CORP., Longueuil, QC (CA)

( * ) Notice: Subject to any disclaimer, the term of this patent is extended or adjusted under 35 U.S.C. 154(b) by 55 days.

(21) Appl. No.: 14/721,751

(22) Filed: May 26, 2015

(65) Prior Publication Data
US 2015/0333721 A1     Nov. 19, 2015

Related U.S. Application Data

(63) Continuation of application No. 13/888,032, filed on May 6, 2013, now Pat. No. 9,099,980.

(51) Int. Cl.
| | |
|---|---|
| *H03G 11/04* | (2006.01) |
| *H03H 7/01* | (2006.01) |
| *G05B 21/02* | (2006.01) |
| *B64C 27/00* | (2006.01) |

(52) U.S. Cl.
CPC ......... *H03H 7/0153* (2013.01); *B64C 27/001* (2013.01); *G05B 21/02* (2013.01); *B64C 2220/00* (2013.01)

(58) Field of Classification Search
CPC ........... B64C 27/001; B64C 2027/002; B64C 2027/004; B64C 2027/005; B64C 2027/003; B64C 2220/00; G05B 21/00; G05B 21/02

USPC ......................................................... 333/17.1
See application file for complete search history.

(56) References Cited

U.S. PATENT DOCUMENTS

| | | | |
|---|---|---|---|
| 4,430,744 A | 2/1984 | Johnson | |
| 5,189,620 A | 2/1993 | Parsons et al. | |
| 5,303,142 A | 4/1994 | Parsons et al. | |
| 5,649,018 A * | 7/1997 | Gifford | F16F 13/26 381/71.14 |
| 5,710,720 A * | 1/1998 | Algrain | F16F 15/02 367/189 |
| 5,910,994 A | 6/1999 | Lane et al. | |
| 6,487,295 B1 | 11/2002 | Lofgren et al. | |
| 6,867,642 B1 | 3/2005 | Maqueira | |
| 7,161,528 B2 | 1/2007 | Kirby et al. | |
| 7,352,553 B2 | 4/2008 | Kozaki et al. | |
| 7,839,304 B2 * | 11/2010 | Riser | B64C 27/001 244/204 |

(Continued)

OTHER PUBLICATIONS

Mink et al. "Adaptive speed control for drives with variable moments of inertia and natural frequencies", LTi DRIVES GmbH Entwicklung Software, Lahnau, Germany, 2011.

*Primary Examiner* — Robert J Pascal
*Assistant Examiner* — Kimberly Glenn
(74) *Attorney, Agent, or Firm* — Norton Rose Fulbright Canada LLP

(57) ABSTRACT

There is described herein a real-time scheme, implementable in software, hardware, or a combination thereof, to detect a resonating frequency of a structure from a sensed signal and dynamically set the center frequency of an adaptive compensator for effective attenuation of the resonating frequency.

16 Claims, 13 Drawing Sheets

(56) References Cited

U.S. PATENT DOCUMENTS

| | | |
|---|---|---|
| 8,829,701 B2 | 7/2014 | Ficklscherer et al. |
| 2002/0118844 A1 | 8/2002 | Welsh et al. |
| 2011/0229319 A1 | 9/2011 | Bacic et al. |

* cited by examiner

FIG. 3F

DYNAMICALLY DETECTING RESONATING FREQUENCIES OF RESONATING STRUCTURES

CROSS-REFERENCE TO RELATED APPLICATIONS

This application is a continuation of U.S. application Ser. No. 13/888,032 filed May 6, 2013, entitled "DYNAMICALLY DETECTING RESONATING FREQUENCIES OF RESONATING STRUCTURES", the entire contents of which is hereby incorporated by reference.

TECHNICAL FIELD

The application relates generally to the detection of resonating frequencies and more particularly, to the detection of dynamically variable resonating frequencies.

BACKGROUND OF THE ART

Many aircraft-based systems having mechanical structures, for example helicopter rotor systems, exhibit mechanical resonances at natural frequencies during operation. These resonating frequencies sometimes propagate to control signals of the system, thereby having a negative impact such as unwanted oscillations. A common approach to address this issue is to use a notch filter to attenuate the resonating frequency components from feedback signals. The notch filter may be designed to eliminate a single frequency or a narrow band of frequencies.

In certain aircraft-based systems, it may be difficult to predict with great precision at what frequency the resonating will occur. A notch filter designed for a given frequency may therefore be inadequate to attenuate the resonating frequencies of the system for which it was intended. Thus, there is a need for a system and method that may be used in such instances.

SUMMARY

There is described herein a real-time scheme, implementable in software, hardware, or a combination thereof, to detect a resonating frequency of a structure from a sensed signal and dynamically set the center frequency of an adaptive compensator for effective attenuation of the resonating frequency.

In one aspect, there is provided a control system for dynamically setting a parameter of an adaptive compensator for attenuating a variable frequency from a resonating structure in an aircraft. The system comprises: a filtering unit comprising a first set of a plurality of frequency filters spaced along a frequency detection range for receiving a sensed signal and outputting a plurality of attenuated power signals. A frequency detection unit is operatively connected to the filtering unit for receiving the plurality of attenuated power signals, identifying two of the frequency filters having a relatively lowest power, and determining a resonating frequency by averaging center frequencies of the two identified frequency filters. An adaptive compensator is operatively connected to the frequency detection unit and has a variable parameter to be set in accordance with the resonating frequency as determined by the frequency detection unit.

In another aspect, there is provided a method for dynamically setting a variable parameter of an adaptive compensator for attenuating a variable frequency from a resonating structure in an aircraft. The method comprises filtering a sensed signal through a first set of a plurality of frequency filters spaced along a frequency detection range and outputting a plurality of attenuated power signals; identifying two of the frequency filters having a relatively lowest power; determining a resonating frequency by averaging center frequencies of the two identified frequency filters; and setting the variable parameter of the adaptive compensator in accordance with the resonating frequency.

In a further aspect, there is provided a control system for dynamically setting a parameter of an adaptive filter for attenuating a variable resonating frequency from a resonating structure in an aircraft. The system comprises a first pre-processing filter connected to an input of the frequency filters for receiving and enhancing a sensed signal from a helicopter rotor system, removing a signal mean therefrom, and outputting a pre-processed signal. A first set of a plurality of overlapping notch filters are spaced along a frequency detection range for receiving the pre-processed signal and outputting a plurality of attenuated signals. A multiplier is connected to an output of each one of the notch filters, for squaring a corresponding attenuated signal from each one of the notch filters and obtaining a corresponding attenuated power signal. An accumulator is connected to an output of each one of the multipliers, for summing the attenuated power signals over a preset interval. An aggregator is connected to the accumulators, for identifying a sub-range within the frequency detection range in which a resonating frequency is located by identifying two of the notch filters having a relatively lowest power, and determining the resonating frequency by averaging center frequencies of the two notch filters as identified, and an adaptive filter is connected to the frequency detection unit and having a variable center frequency to be set in accordance with the resonating frequency as determined by the frequency detection unit.

In another aspect, there is provided a method for attenuating a frequency from a structure with resonant properties. The method comprises dynamically detecting a resonating frequency of the structure during closed loop operation thereof by filtering a sensed signal from the structure through a bank of filters spaced along a frequency detection range; setting a variable parameter of an adaptive compensator in accordance with the resonating frequency as detected; and attenuating the frequency from the structure using the adaptive compensator set in accordance with the resonating frequency as detected.

In yet another aspect, there is provided a system for attenuating a frequency from a structure with resonant properties. The system comprises a filtering and detection unit comprising a bank of filters spaced along a frequency detection range for receiving a sensed signal and dynamically detecting a resonating frequency of the structure during closed loop operation thereof; and an adaptive compensator operatively connected to the filtering and detection unit, the adaptive compensator having a variable parameter to be set by the filtering and detection unit in accordance with the resonating frequency as detected and configured to receive the sensed signal attenuate the resonating frequency therefrom.

DESCRIPTION OF THE DRAWINGS

Reference is now made to the accompanying figures in which:

FIG. 3b is a block diagram showing exemplary embodiments for the filtering unit and frequency detection unit of FIG. 3a;

FIG. 3f is a block diagram of another exemplary embodiment of the control system with an added dynamic range centering unit;

DETAILED DESCRIPTION

Figure 1A:
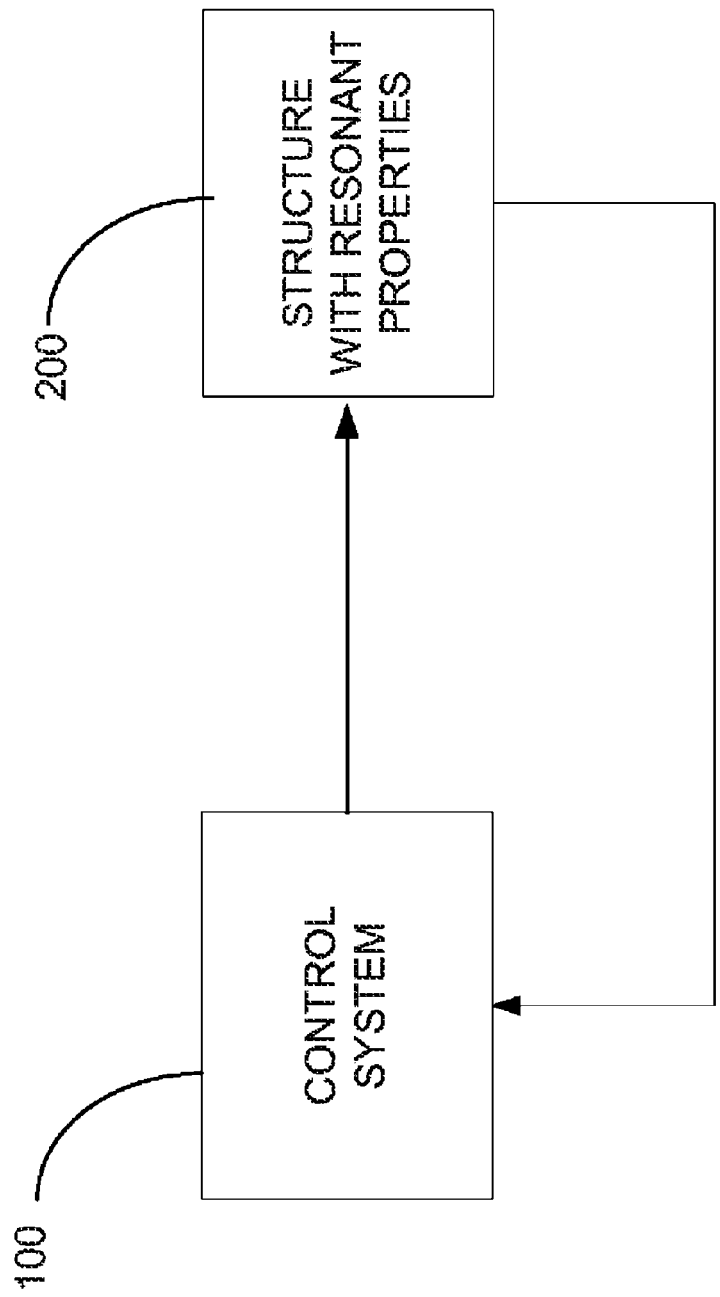
FIG. 1a is a block diagram of an exemplary system for filtering a resonant frequency occurring in a structure having resonant properties.

There is illustrated in FIG. 1a an exemplary system for detecting a resonant frequency occurring in a structure having resonant properties. A control system 100 is connected to the structure having resonant properties 200. The control system 100 dynamically computes a frequency of structural resonance in real-time during normal closed-loop operation and accordingly sets the parameters of an adaptive compensator, such as a filter, a control loop, or other types of compensators, as will be explained in more detail below. The control system 100 may be used for any structure having resonant properties 200, such as but not limited to, gimbaled turrets, control of helicopters, stabilization platforms, gyroscopic rate sensors, computer hard drives, and flexible robotic manipulators.

Figure 1B:
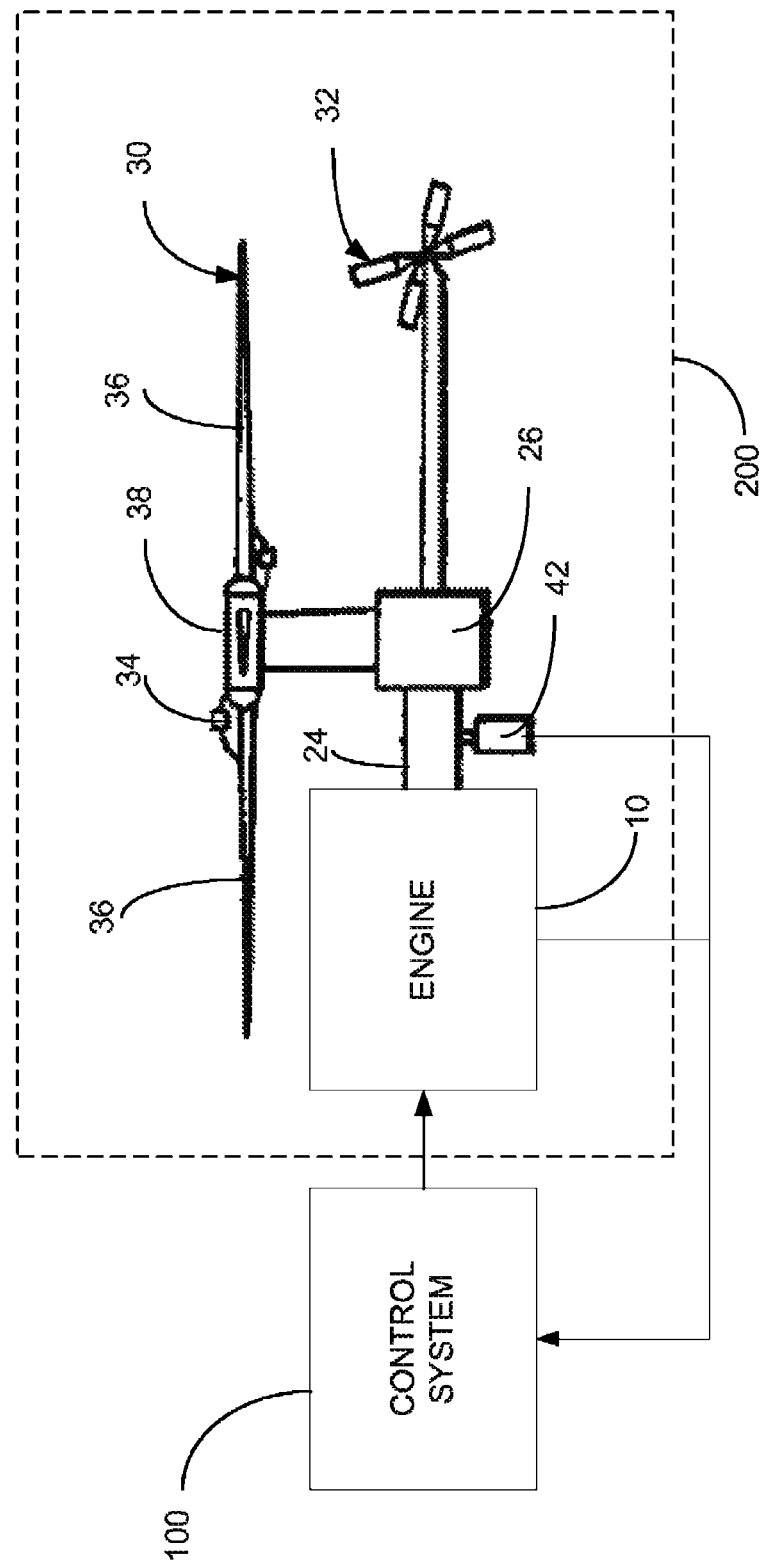
FIG. 1b is a schematic diagram of an exemplary system for filtering a resonant frequency occurring in a helicopter rotor.

Referring to FIG. 1b, there is shown an exemplary embodiment for the structure 200 corresponding to a helicopter rotor-damper system. A rotor shaft 24 may mechanically couple via a gearbox 26 to a main rotor 30 and a tail rotor 32 of a helicopter. Viscous lag dampers 34 may be coupled between blades 36 of the main rotor 30 and a rotor hub 38 to increase the damping of the torsional oscillations of the main rotor 30 and of the tail rotor 32, such oscillations illustratively occurring at frequencies in a range of 2 to 8 Hz. Alternatively, the dampers 34 may be positioned between each blade 36. A rotor drive train illustratively comprises the gearbox 26, the main rotor blades 36, the rotor hub 38, and the tail rotor 32.

A sensor 42 may further be coupled to the rotor shaft 24 to provide an output signal representative of engine speed. The control system 100 may receive the turbine speed or torque measurement along with additional engine parameters and output signals used for controlling the operation of an engine 10. In particular, the control system 100 may be used to modulate a flow of fuel to the engine 10 in order to increase the damping of the torsional oscillations of the rotor drive train. Alternatively to active damping, the natural torsional oscillations of the rotor drive system may be attenuated from the measured signal to prevent the control system 100 from reacting, leading to dynamic instability. As more load is usually present on the main rotor blades 36, torsional oscillations of the main rotor 30 may be dominant, and thus more problematic, and it may therefore be desirable to mainly attenuate the main rotor resonance. Still, although the description below refers to attenuating of the resonance of the main rotor 30, it should be understood that the resonance of the tail rotor 32 may also be attenuated. The control system 100 may be used to filter out unwanted frequencies elsewhere in an aircraft or in a gas turbine engine, such as natural modes. The aircraft-based control system may also be used for aircrafts other than helicopters (such as fixed wing aircrafts) and other engine types.

Figure 2:
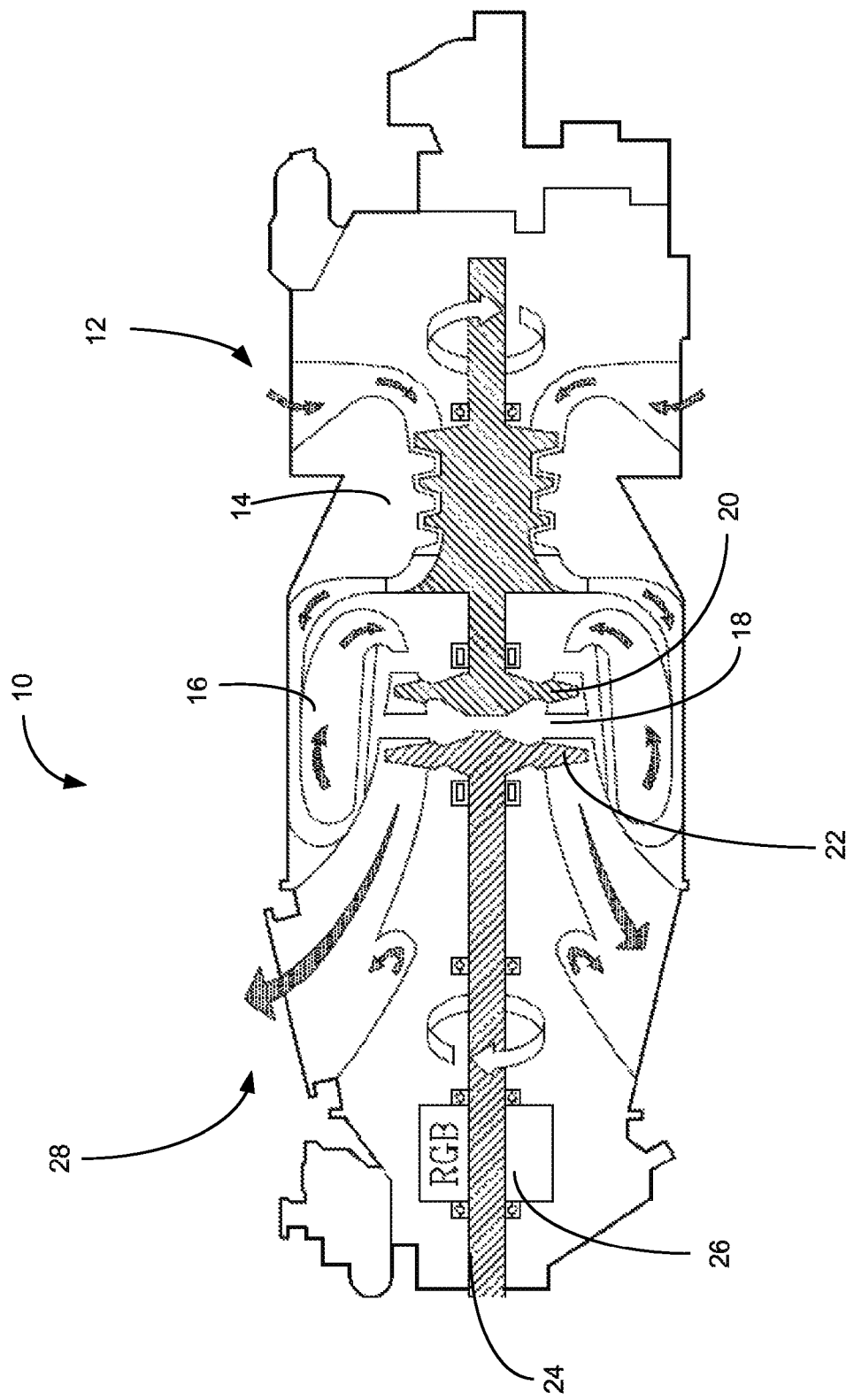
FIG. 2 is a schematic side cross-sectional view of an exemplary gas turbine engine.

FIG. 2 illustrates an exemplary engine 10, namely a gas turbine engine, comprising an inlet 12, through which ambient air is propelled, a compressor section 14 for pressurizing the air, a combustor 16 in which the compressed air is mixed with fuel and ignited for generating an annular stream of hot combustion gases, and a turbine section 18 for extracting energy from the combustion gases. The turbine section 18 illustratively comprises a compressor turbine 20, which drives the compressor assembly and accessories, and at least one power or free turbine 22, which is independent from the compressor turbine 20 and drives the rotor shaft 24 through the reduction gearbox 26. Hot gases may then be evacuated through exhaust stubs 28. The gas generator 29 of the engine 10 illustratively comprises the compressor section 14, the combustor 16, and the turbine section 18.

The control system 100 may be part of a Full Authority Digital Engine Control (FADEC) used to manage operation of the engine 10 by modulating fuel flow thereto, thereby controlling the engine 10 through acceleration, deceleration, and steady state operation. As such, the control system 100 may comprise a digital computer or Engine Control Unit (ECU, not shown) in communication with the hardware of the engine 10 for controlling an operation of the latter. The control system 100 may then be implemented as a processor-based system where the term processor may refer to a microprocessor, application specific integrated circuits (ASIC), logic circuits, or any other suitable processor or circuit know to those skilled in the art.

Figure 3A:
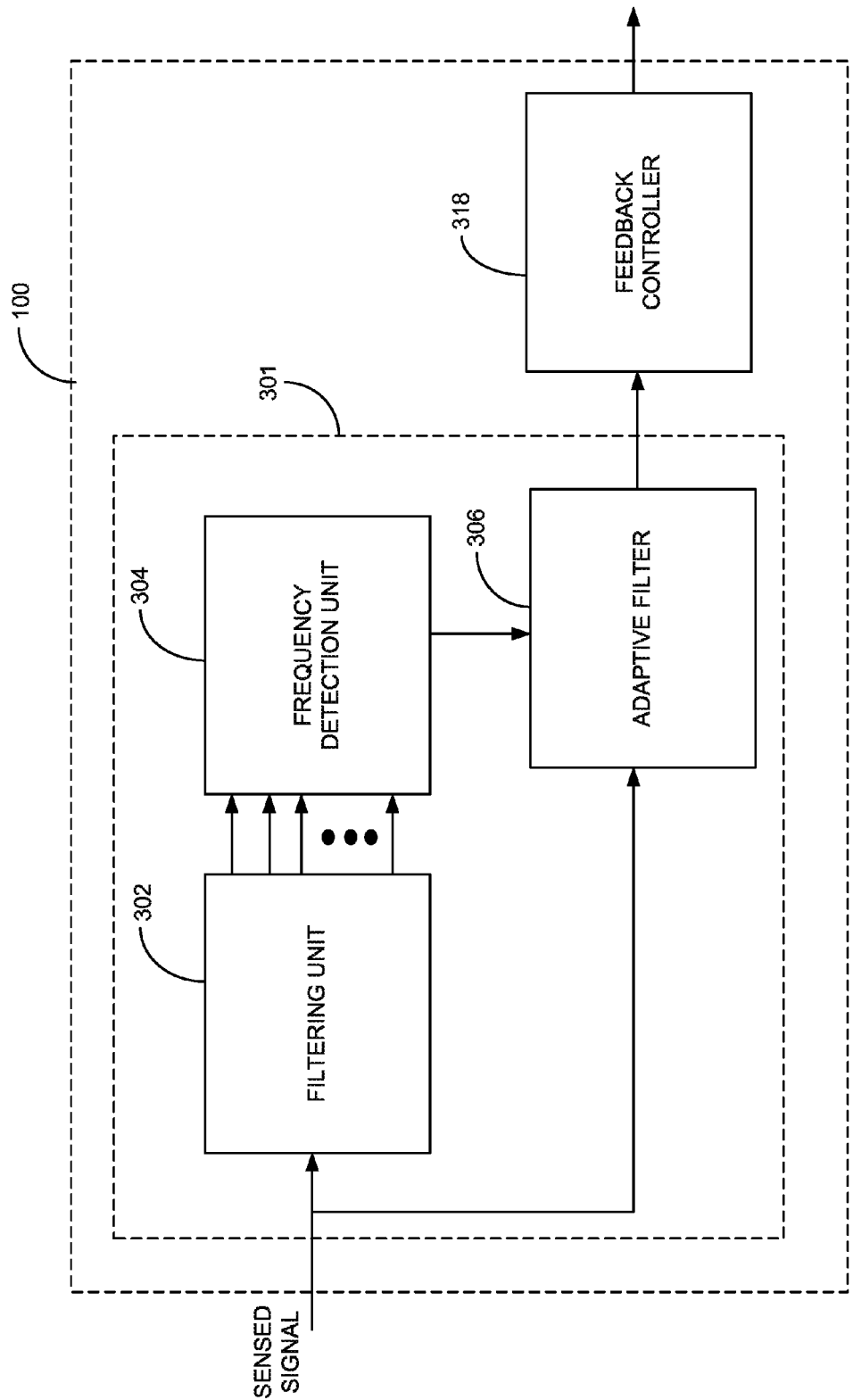
FIG. 3a is a block diagram of an exemplary embodiment of the control system of FIGS. 1a and 1b.

Referring to FIG. 3a, the control system 100 illustratively comprises an adaptive pre-compensating module 301 comprising a filtering unit 302, a frequency detection unit 304 and an adaptive compensator, which will be referred to as an adaptive filter 306 for the purposes of the present description. The control system also comprises a feedback controller 318. The filtering unit 302 comprises a bank of filters spaced along a frequency detection range. A sensed signal needing to be filtered is received by both the filtering unit 302 and the adaptive filter 306. The sensed signal may be any signal shaping/filtering function in a control system, such as torque, speed, and pressure measurements. The filtering unit 302 filters the sensed signal at a plurality of frequencies within the frequency detection range using the bank of filters and outputs a plurality of attenuated power signals. The frequency detection unit 304, operatively connected to the filtering unit 302, receives the attenuated power signals and identifies two filters from the bank of filters with the relatively lowest power. The range between the center frequencies of the two filters is indicative that the structure 200 has a resonating frequency within this frequency range. The frequency detection unit 304 determines the resonating frequency by averaging the center frequencies of the two frequency filters using a weighted average paradigm, where the weights are respectively proportional to the level of attenuation of each filter. The resulting value is used to set the center frequency of the adaptive filter 306 in order to suppress the resonance from the sensed signal.

Figure 3B:
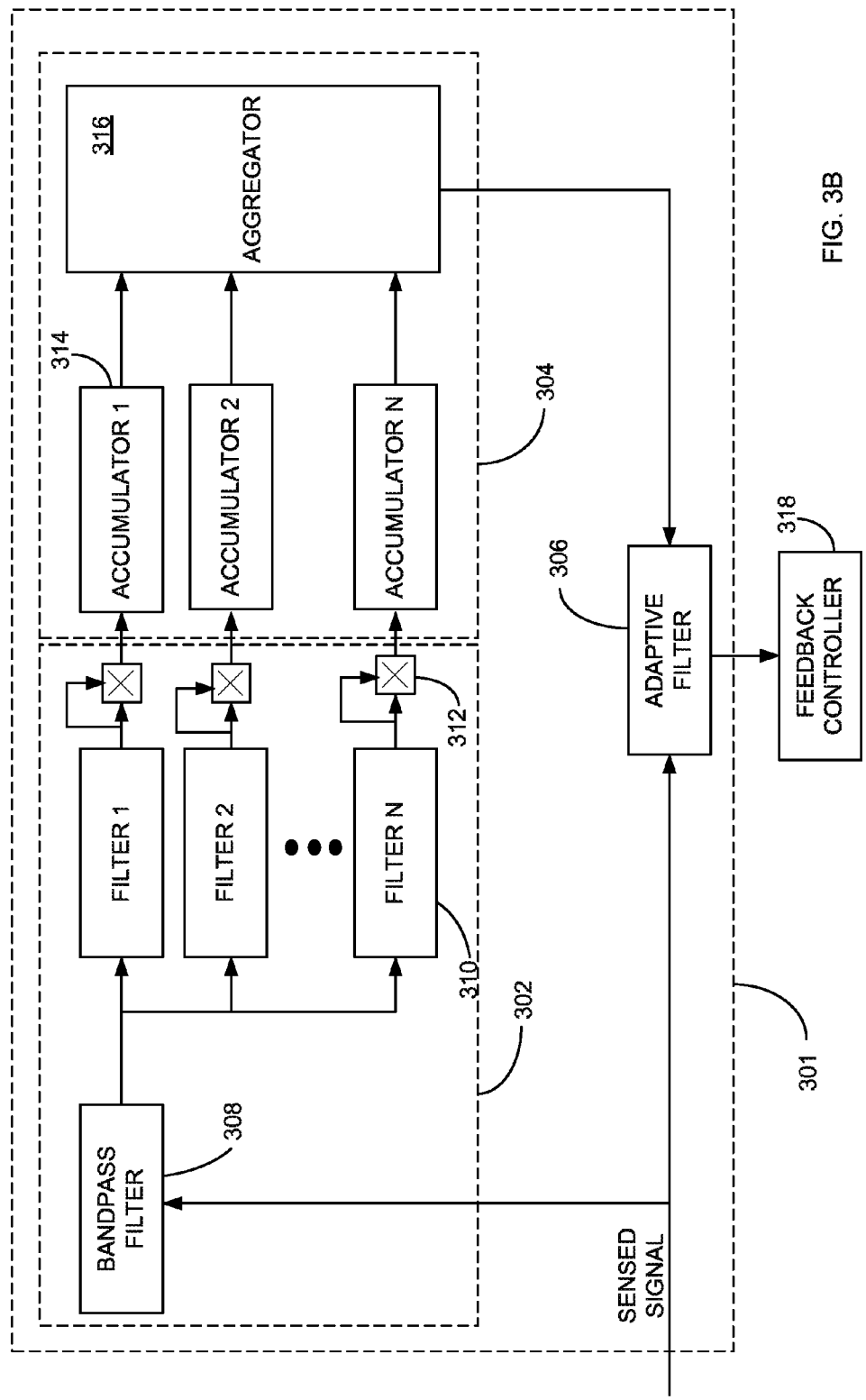

FIG. 3b illustrates a first exemplary embodiment for the filtering unit 302 and the frequency detection unit 304. The filtering unit 302 illustratively comprises a band-pass filter 308, a bank of filters 1 to N (collectively referred to as 310), and a corresponding multiplier (collectively referred to as 312) for each filter 1 to N. The bank of filters 310 may be filters that pass most frequencies unaltered but attenuate those in a specific range to very low levels, i.e. band-stop filters or band-rejection filters, such as notch filters. Other types of filters, such as combinations of high and low pass filters, may also be used.

The number of filters 310 may be set as desired to cover a predetermined frequency range. The spacing between the filters may also be set as desired, as a function of the number of filters in the bank of filters 310 and the frequency range to be covered. Accuracy may be a factor in deciding how to space the filters in the bank of filters 310, as accuracy is reduced when spacing is increased, and desired computational speed may impose a limit on the number of filters. For example, six filters may be spaced over a range of 2 Hz, with 0.4 Hz between the center frequencies of each filter in the bank 310. Other examples with the same spacing between center frequencies include having twelve filters over a range of 4 Hz and eighteen filters over a range of 6 Hz. Other values for spacing between filters may also be used, such as 0.2 Hz, 0.4 Hz, 0.5 Hz, etc. The filters do not need to be evenly spaced but even spacing provides a same degree of frequency detection accuracy across the detection range. If unevenly spaced, it may be desirable to keep the spacing low in order to increase accuracy. Similarly, the filters do not need to overlap, although accuracy may also be affected in such a case. The filters in the bank 310 may be provided with a same width and/or depth, or have some minor variances therebetween. They may be fixed filters or adaptive filters capable of having their center frequency modified post-design. In some embodiments, the center frequencies of the adaptive filters in the bank 310 may be set dynamically such that their overall range is continuously centered around the resonating frequency. This range centering function provides an extended working range for the frequency detection.

The band-pass filter 308, or any other type of pre-processing, may be used to enhance the sensed signal at a predetermined frequency detection range, as well as zero out the mean of the original signal. The zeroing of the signal mean provides a comparable signal power which is calculated after the band-passed signal is passed through the bank of filters 310. Having the filters in the bank 310 be spaced apart and each falling within the predetermined frequency detection range provides a comparatively distinguishable degree of attenuation from each filter. The output of each filter from the bank 310 is squared by the multipliers 312 in order to obtain the attenuated signal power, which are then passed on to the frequency detection unit 304.

The frequency detection unit 304 illustratively comprises a set of accumulators (collectively referred to as 314) and an aggregator 316. The accumulators 314 receive the attenuated signal powers from the multipliers 312 and accumulate each sum signal power over a small preset interval, such as six frames of 20 ms intervals, for example. At the end of each interval, the aggregator 316 locates the resonating frequency between two adjacent filters from the bank 310 with the lowest relative power. The resonating frequency is then calculated by averaging center frequencies of the two frequency filters using a weighted average paradigm where the weights are respectively proportional to the level of attenuation of each filter.

Figure 3C:
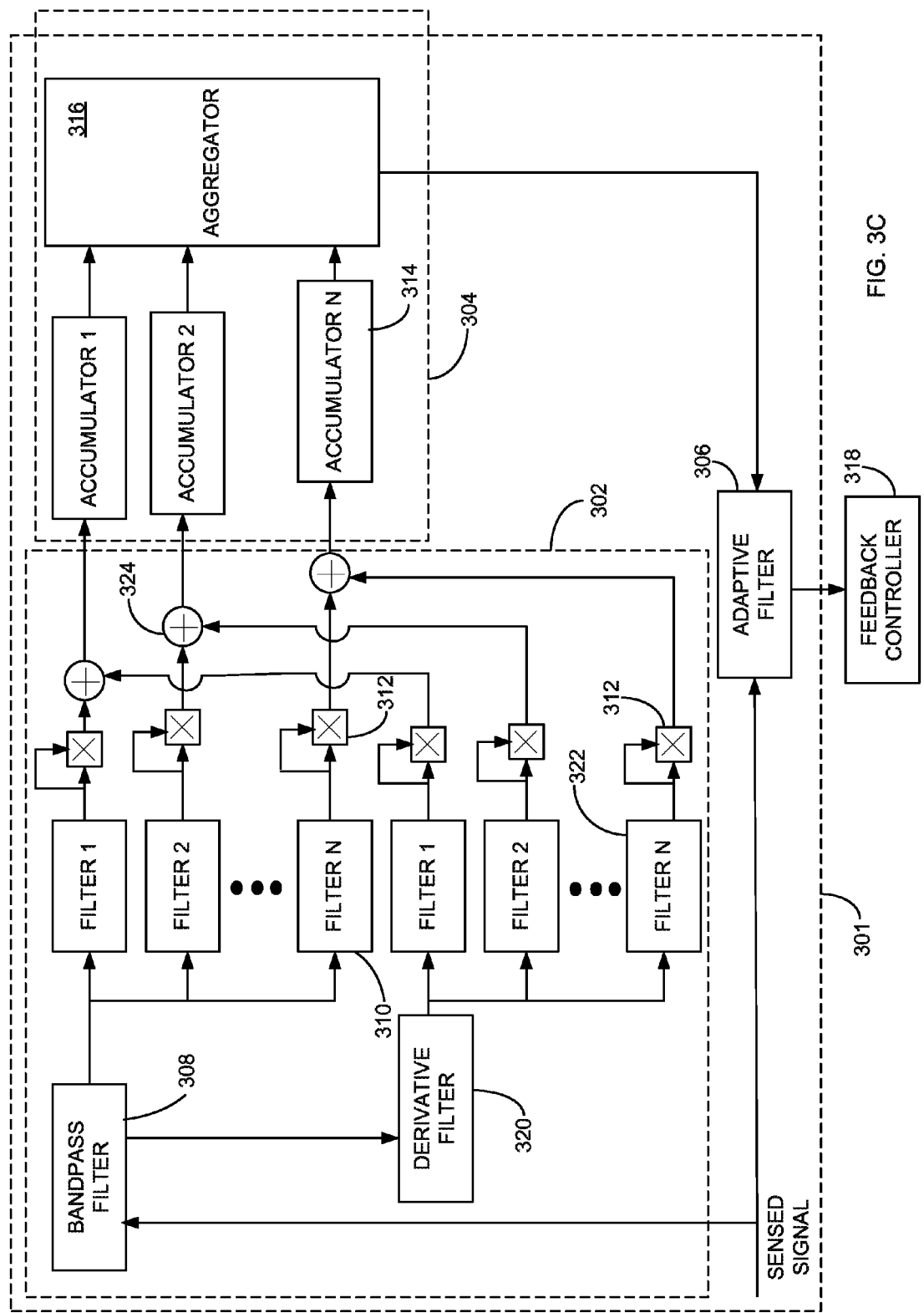
FIG. 3c. is a block diagram of another exemplary embodiment of the filtering unit with an added derivative path.

In some embodiments, the frequency is identified by using the pattern of the frequency on two or more signals, such as the signal and its derivative. A derivative path is added to the filtering unit 302 in order to reduce small flickers in the detected frequency due to additional noise of other frequencies in the sensed signal. This is illustrated in FIG. 3c, where the derivative path illustratively comprises a derivative filter 320, a second bank of filters 1 to N (collectively referred to as 322), a multiplier 312 after each filter, and a set of summers (collectively referred to as 324). The derivative filter 320 receives as input the band-passed signal from band-pass filter 308 and outputs its derivative, which is then passed through the second bank of filters 322. The outputs are squared by the multipliers 312 to obtain the attenuated signal power and these signal powers are summed with the signal powers of the first bank of filters 310 by summers 324. That is to say, the power from filter 1 of bank 310 is added to the power of filter 1 of bank 322, the power of filter 2 of bank 310 is added to the power of filter 2 of bank 322, and the power of filter N of bank 310 is added to the power of filter N of bank 322. The summation of two corresponding attenuated signal powers, one being the derivative of the other, helps enhance the localization of the resonating frequency and may also help improve detection speed. In an alternative example, a lead filter can be used instead of a derivative filter.

Figure 3D:
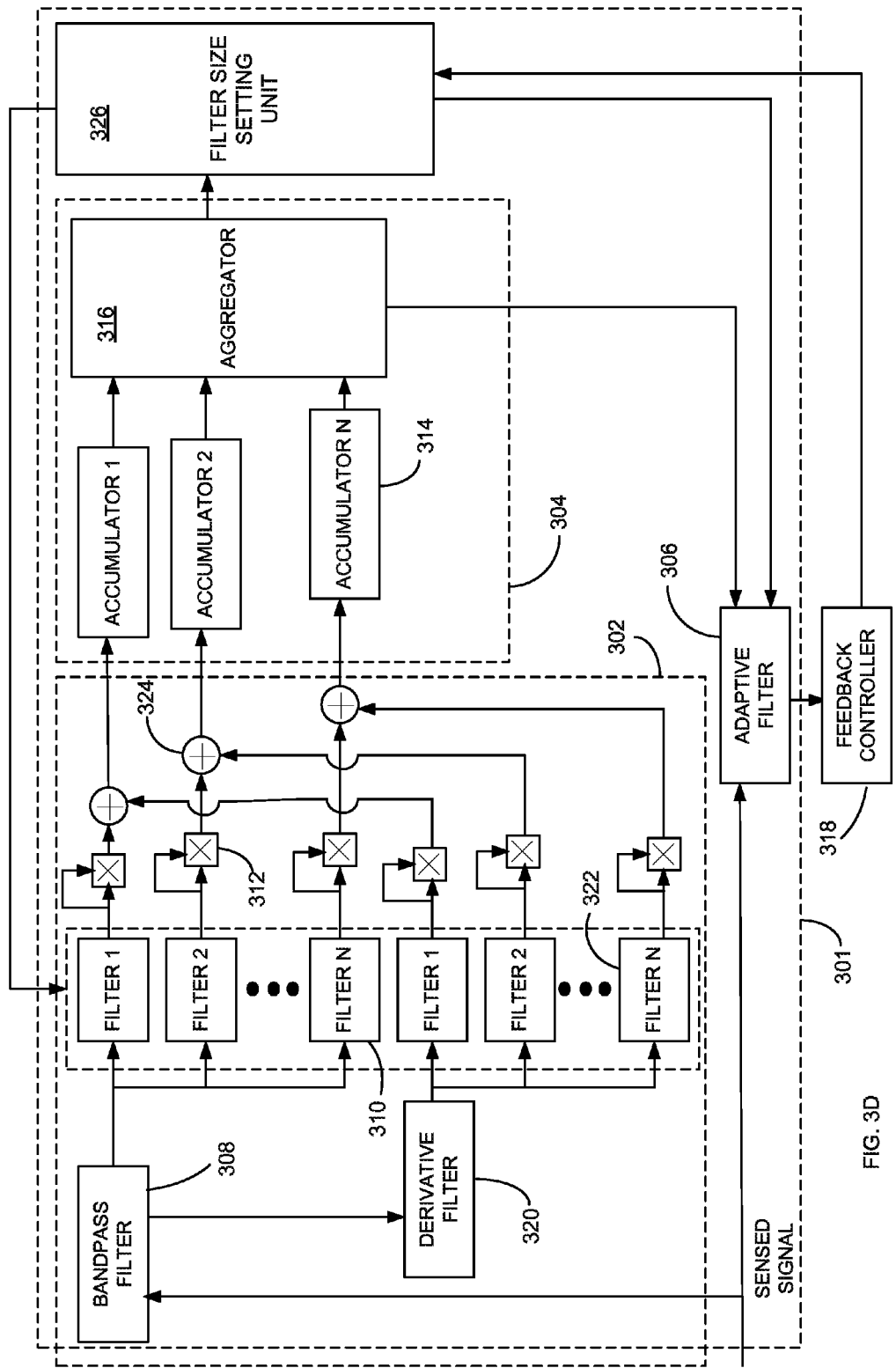
FIG. 3d. is a block diagram of an exemplary embodiment of the control system with an added filter size (i.e. width and/or depth) setting unit.

In some embodiments, the depth and/or width of adaptive filter 306 may be set dynamically. This is illustrated in FIG. 3d, wherein a filter size setting unit 326 illustratively receives the resonating frequency as calculated from the frequency detection unit 304, in this case the aggregator 316, and sets at least one of width and depth accordingly. As the resonating frequency may vary slightly after detection, a wider filter will provide the adaptive filter 306 with flexibility to capture the variations. However, it may be desirable to have a deeper adaptive filter 306 to ensure more attenuating of the resonating frequency. A fluctuating signal may require a wider filter 306 while a stable signal may allow for a deeper filter 306. The filter size setting unit 326 may thus be adapted to optimize the depth and width to meet desired criteria with regards to attenuating and post-detection variations. Similarly, the filter size setting unit 326 may be used to dynamically set the depth and/or width of filters 310, 322. This adaptation of filter(s) depth and width can be functioning simultaneously with frequency variation. In application, the approach to vary the width can be based on the time-weighted amplitude variation of the detected frequency, i.e., widen the notch filter when the detected frequency is hunting (oscillating) and narrow the width (which in turns deepen) when the frequency locks in.

In some embodiments, the filter size setting unit 326 is also adapted to take into account lag effects within the feedback control loop of the system. As illustratively shown, the adaptive filter 306 may send the filtered signal to a feedback controller 318, which may be, for example, a proportional-integral-derivative (PID) controller as used in several industrial control systems. The feedback controller 318 may be affected if the adaptive filter 306 is too wide or too close to the bandwidth of the feedback controller 318, thus causing a lag. If the lag is too high, the feedback loop may then be affected. Since the control loop performance is affected by the phase lag inherently introduced by the filter(s), depending on their width and their location (frequency) from the control loop bandwidth, a lag effect may be defined as a function of the filter(s) width/depth. This parameter may then be used by the filter size setting unit 326 to limit the width/depth variation to maintain a desired control performance.

Figure 3E:
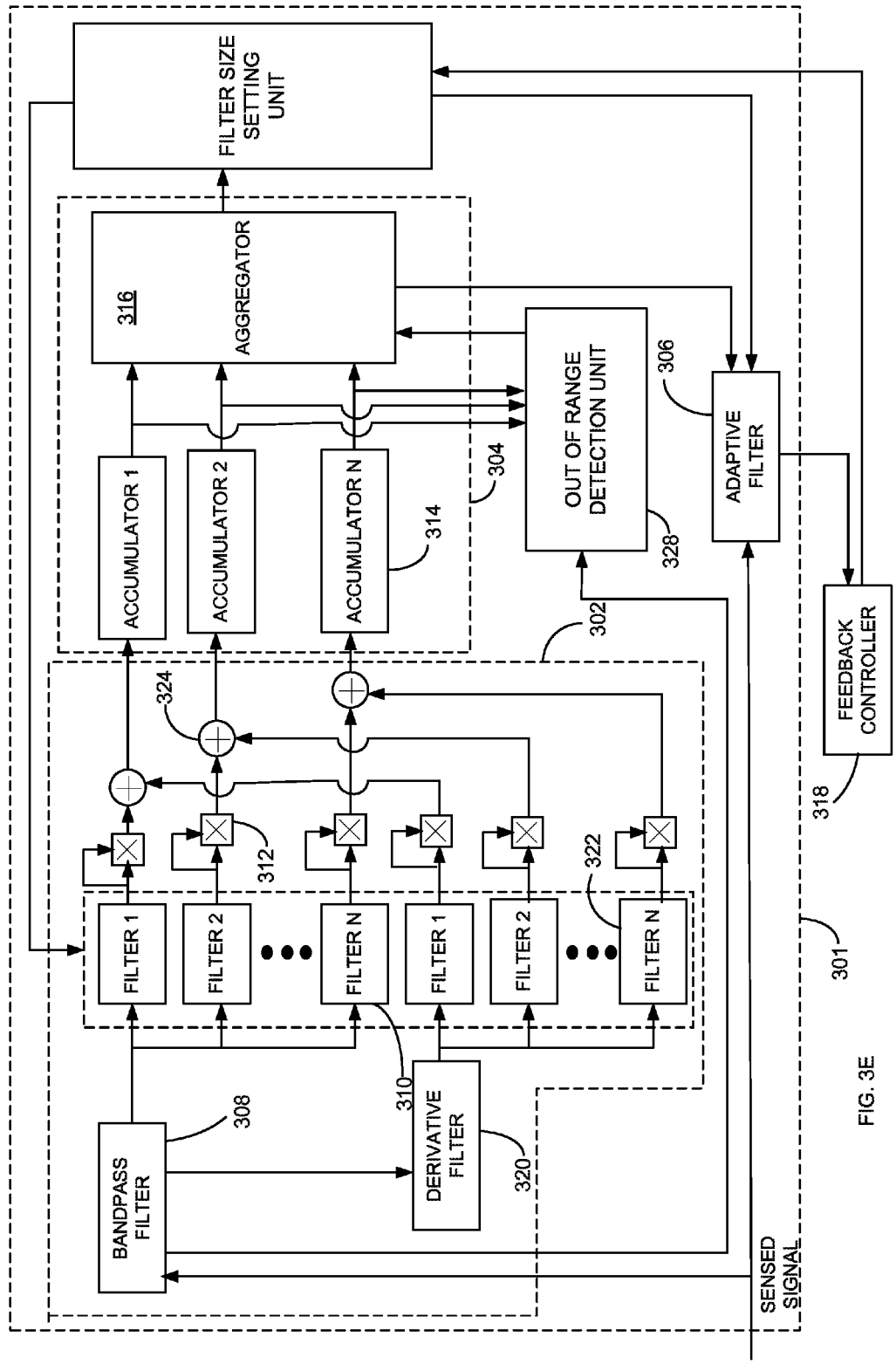
FIG. 3e. is a block diagram of another exemplary embodiment of the control system with an added out of range detection unit.

In some embodiments, it may be desirable to determine if the resonating frequency is beyond the intended detection range. This may be done using an out of range detection unit 328, as illustrated in FIG. 3e. The out of range detection unit 328 may be used to detect out of range signals and freeze the resonating frequency of the adaptive filter 306 to the last known detected value. Various algorithms may be used to detect out of range signals.

Figure 3F:
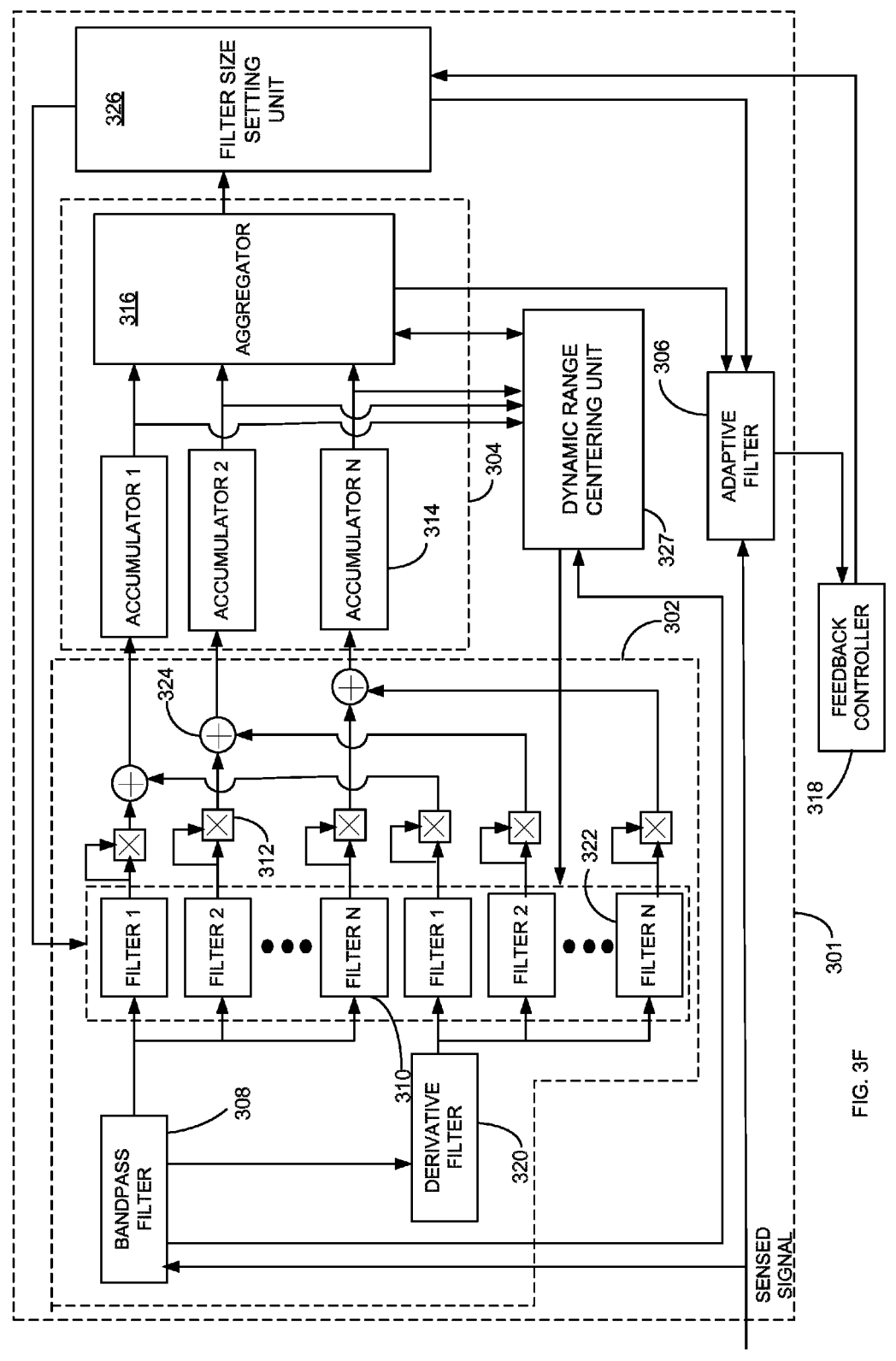

As indicated above, the center frequencies of the filters in the bank 310 may be set dynamically such that their overall range is continuously centered around the resonating frequency. This range centering function provides an extended working range for the frequency detection. A dynamic range centering unit 327 is illustrated in FIG. 3f, and receives as input a signal from band-pass filter 308, the outputs of the accumulators 314, and the output of the aggregator 316. Its output is then sent to the bank of filters 310/312 and to the aggregator 316. Various algorithms may be used to continuously vary and center the frequency detection range around the detected resonating frequency. One exemplary algorithm can be to keep the spacing of adaptive filters 310, 322 fixed and employ the last detected frequency as the center frequency of range and redistribute the center frequencies of individual adaptive filters evenly around the range center. The redistributed adaptive filters will be used for frequency detection in the next cycle. In order to prevent hunting behavior, this redistribution or re-centering step can be a function of weighted and/or time delayed history of the detected frequency. The spacing of filters 310, 322 can also be expanded with or without widening the individual filters 310, 322 if the detected frequency is oscillating. When the detected frequency settles, the spacing and width can gradually return to their optimal designed values. The dynamic frequency centering unit 327 may provide a wider range of detectable frequencies while ensuring accuracy.

Figure 4:
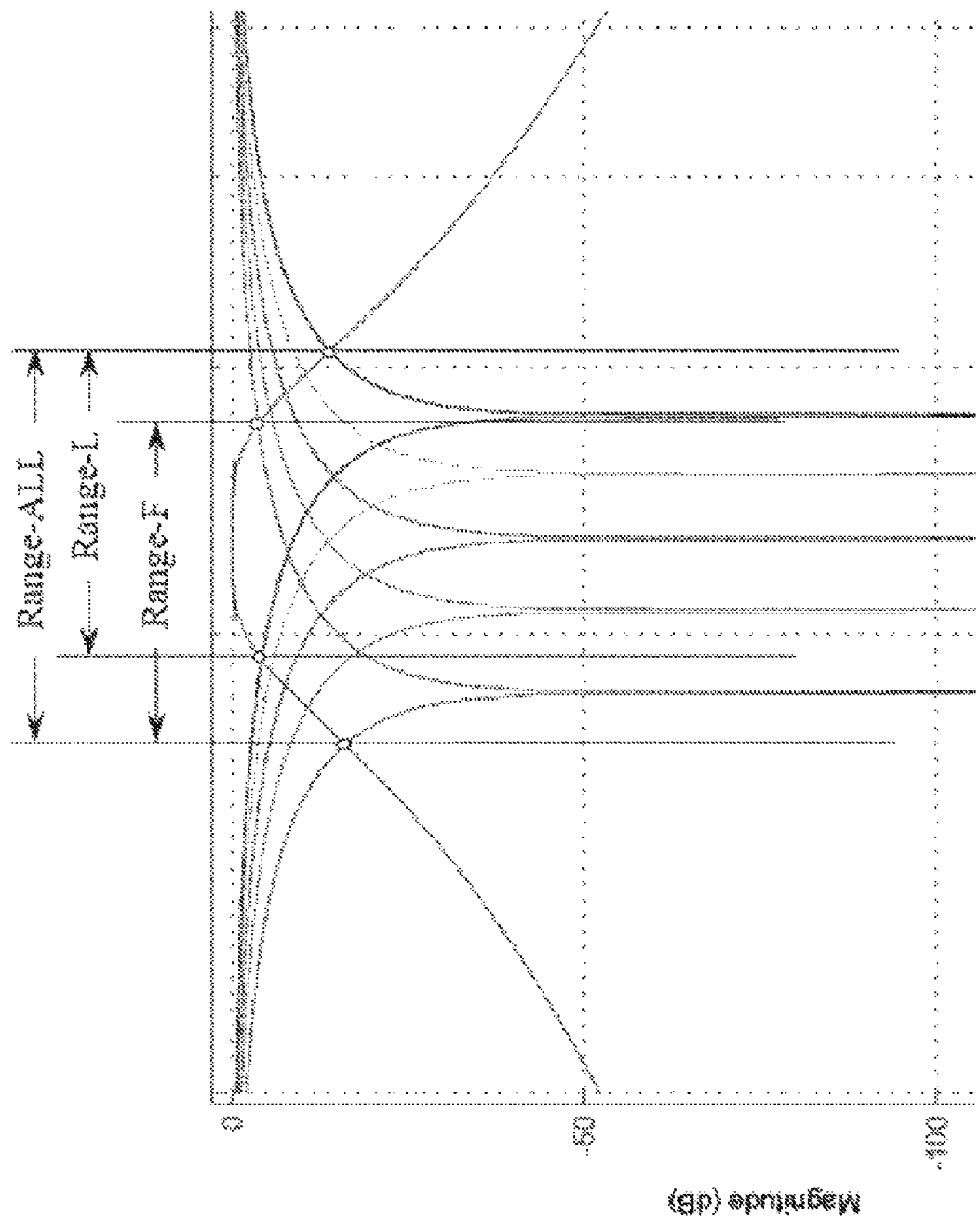
FIG. 4 is a Bode plot of the bank filters.

Referring to FIG. 4, two exemplary algorithms are described. In a first algorithm, the band-pass filtered signal power from band-pass filter 308 is compared to the power from the first filter of bank 310 and "Range-F" is obtained. The same signal power is compared to the power from the last filter of bank 310 and "Range-L" is obtained. A condition is set such that if the band-pass filtered signal power is lower than "Range-F" OR "Range-L", then the resonating frequency is out of range. In a second algorithm, the band-pass filtered signal power from band-pass filter 308 is compared to the minimum power from the bank of filters 310, which corresponds to "Range-All". The condition set is such that if the band-pass filtered signal power is lower than "Range-All", then the signal is out of range. Other algorithms to detect out of range signals may also be used.

Figure 5:
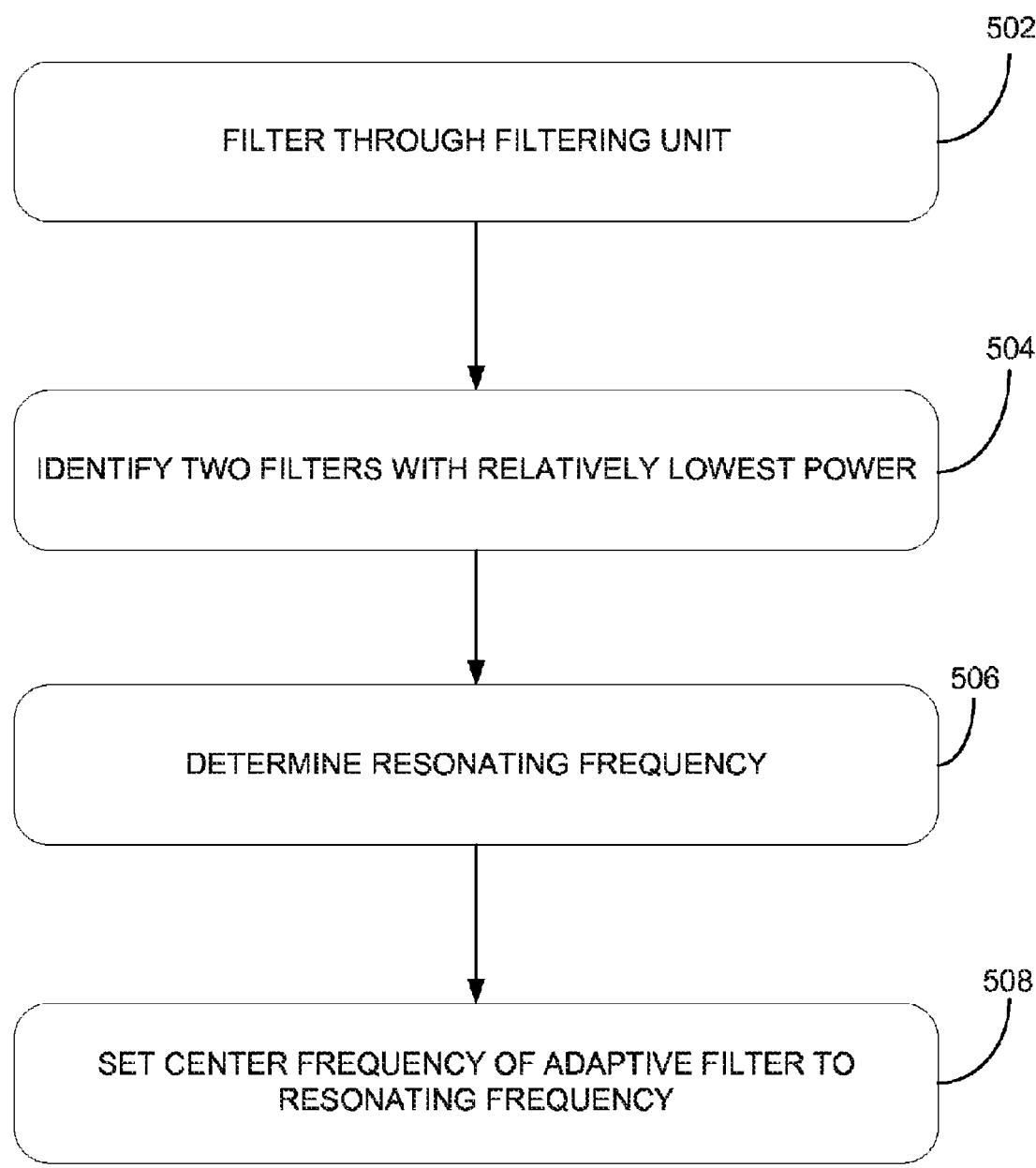
FIG. 5 is a flowchart of an exemplary method for dynamically setting an attenuation frequency of an adaptive filter.

Referring now to FIG. 5, there is illustrated a method for dynamically setting the attenuation frequency of an adaptive filter, as performed by the control system 100 illustrated in FIG. 3a. As per the above description, a sensed signal is filtered through a first set of a plurality of frequency filters spaced along a frequency detection range 502 and a plurality of attenuated power signals are output. The two filters having the relatively lowest power are identified 504. The resonating frequency is determined 506 by aggregating the center frequencies of the two filters and their corresponding attenuated power signals, and the center frequency of the adaptive filter is set to the resonating frequency 508.

Figure 6A:
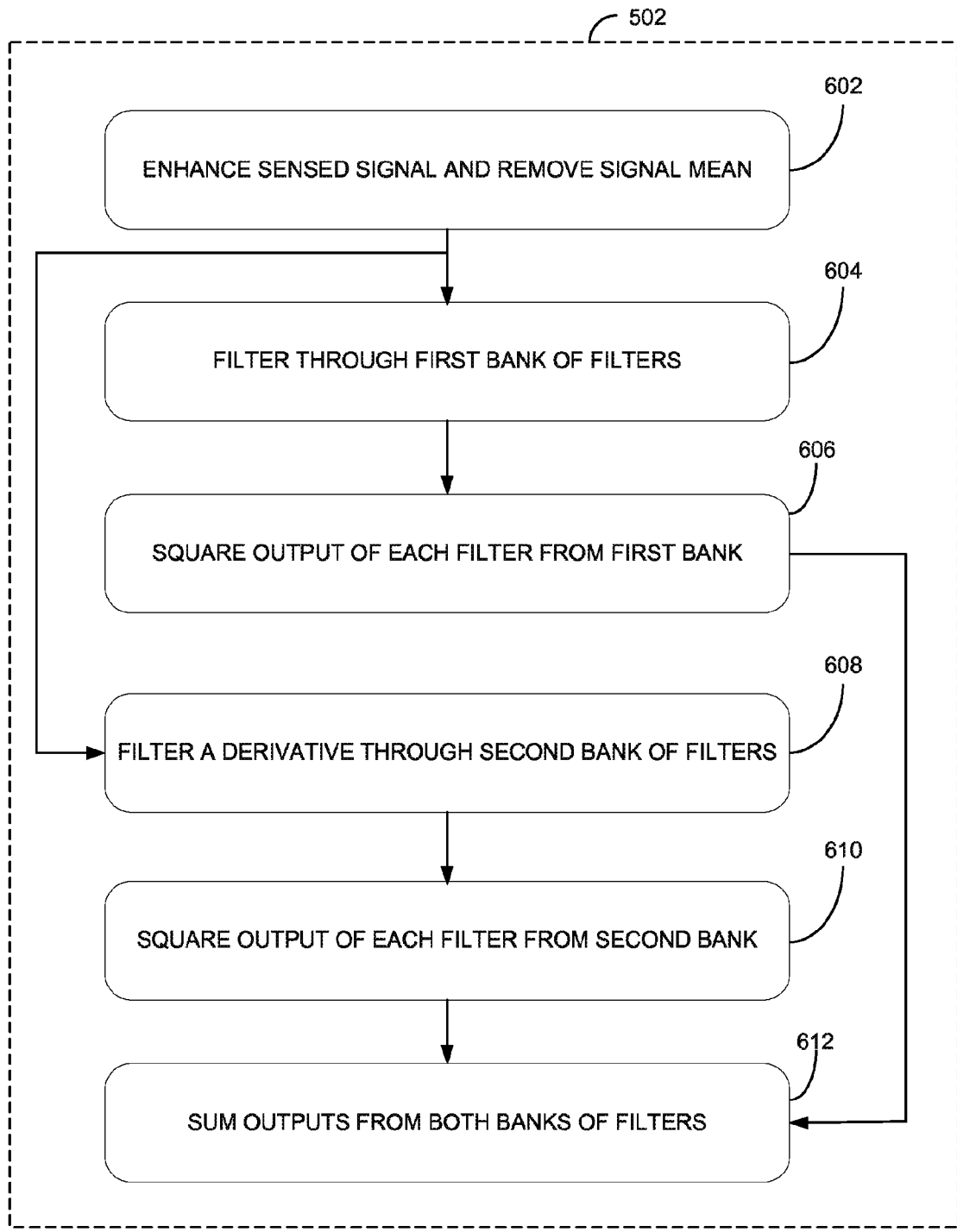
FIG. 6a is a flowchart of an exemplary method of filtering.

FIG. 6a illustratively shows an exemplary embodiment for filtering the sensed signal through the filtering unit 502, as performed by the embodiment of the filtering unit 302 illustrated in FIG. 3c. The sensed signal is enhanced and the signal mean is removed therefrom 602. The resulting signal is filtered through a first bank of filters 604 and the output of each filter from the first bank is squared 606 to obtain the attenuated signal power. In parallel, a derivative of the resulting signal is filtered through a second bank of filters 608 and the output of each filter from the second bank is squared 610 to obtain the attenuated signal power. The attenuated signal powers from both banks of filters are summed together 612.

Figure 6B:
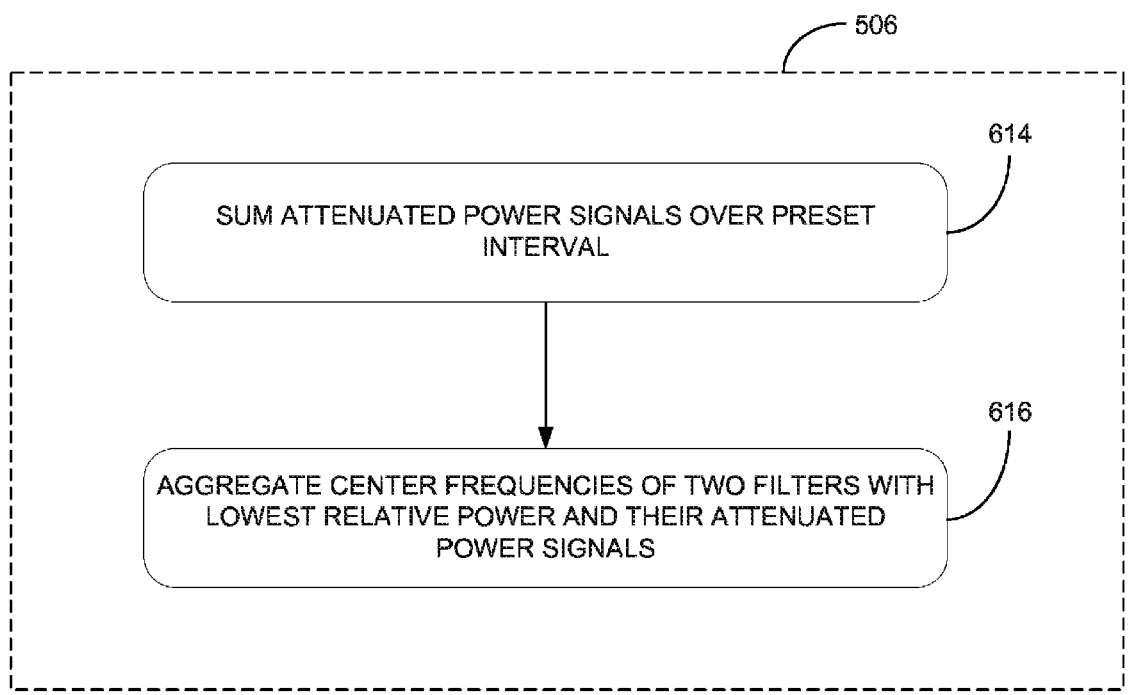
FIG. 6b is a flowchart of an exemplary method of determining a resonating frequency.

FIG. 6b illustratively shows an exemplary embodiment for determining the resonating frequency 506, as performed by the frequency detection unit 304 illustrated in FIG. 3c. The attenuated power signals, as received from the filtering unit 302, are summed over a preset interval 614. The center frequencies of the two filters with the lowest relative power, as identified in step 504, are aggregated with the attenuated power signals of the same two filters. The resulting value is the resonating frequency of the structure, which will be used to set the center frequency of the adaptive filter 306.

The above description is meant to be exemplary only, and one skilled in the art will recognize that changes may be made to the embodiments described without departing from the scope of the invention disclosed. Modifications which fall within the scope of the present invention will be apparent to those skilled in the art, in light of a review of this disclosure, and such modifications are intended to fall within the appended claims.

The invention claimed is:

1. A method for attenuating a frequency from a gas turbine engine system comprising a helicopter rotor-damper system and an engine, the method comprising:
   dynamically detecting a resonating frequency of the gas turbine engine system during closed loop operation thereof by filtering a sensed signal from the gas turbine engine system through a bank of filters spaced along a frequency detection range;
   setting a variable parameter of an adaptive compensator in accordance with the resonating frequency as detected; and
   attenuating the frequency from the gas turbine engine system using the adaptive compensator set in accordance with the resonating frequency as detected.

2. The method of claim 1, wherein the system is part of a full authority digital engine control (FADEC) for managing operation of the engine.

3. The method of claim 1, wherein the bank of filters comprises adaptive filters, and the method comprises dynamically setting center frequencies of the bank of filters to maintain an overall range centered around the resonating frequency as detected.

4. The method of claim 1, wherein the bank of filters comprises overlapping filters to fully cover the frequency detection range.

5. A system for attenuating a frequency from a gas turbine engine system comprising a helicopter rotor-damper system and an engine, the system comprising:
   a filtering and detection unit comprising a bank of filters spaced along a frequency detection range for receiving a sensed signal and dynamically detecting a resonating frequency of the gas turbine engine system during closed loop operation thereof; and
   an adaptive compensator operatively connected to the filtering and detection unit, the adaptive compensator having a variable parameter to be set by the filtering and detection unit in accordance with the resonating frequency as detected and configured to receive the sensed signal attenuate the resonating frequency therefrom.

6. The system of claim 5, wherein the system is part of a full authority digital engine control (FADEC) for managing operation of the engine.

7. The system of claim 5, wherein the bank of filters comprises adaptive filters, and the method comprises dynamically setting center frequencies of the bank of filters to maintain an overall range centered around the resonating frequency as detected.

8. The system of claim 5, wherein the bank of filters comprises overlapping filters to fully cover the frequency detection range.

9. A method for attenuating a frequency from a gas turbine engine system, the method comprising:
    dynamically detecting a resonating frequency of the gas turbine engine system during closed loop operation thereof by filtering a sensed signal from the gas turbine engine system through a bank of filters spaced along a frequency detection range and comprising overlapping filters to fully cover the frequency detection range;
    setting a variable parameter of an adaptive compensator in accordance with the resonating frequency as detected; and
    attenuating the frequency from the gas turbine engine system using the adaptive compensator set in accordance with the resonating frequency as detected.

10. The method of claim 9, wherein the gas turbine engine system comprises a helicopter rotor-damper system and an engine.

11. The method of claim 10, wherein the system is part of a full authority digital engine control (FADEC) for managing operation of the engine.

12. The method of claim 9, wherein the bank of filters comprises adaptive filters, and the method comprises dynamically setting center frequencies of the bank of filters to maintain an overall range centered around the resonating frequency as detected.

13. A system for attenuating a frequency from a gas turbine engine system, the system comprising:
    a filtering and detection unit comprising a bank of filters spaced along a frequency detection range comprising overlapping filters to fully cover the frequency detection range, the filtering and detection unit for receiving a sensed signal and dynamically detecting a resonating frequency of the gas turbine engine system during closed loop operation thereof; and
    an adaptive compensator operatively connected to the filtering and detection unit, the adaptive compensator having a variable parameter to be set by the filtering and detection unit in accordance with the resonating frequency as detected and configured to receive the sensed signal attenuate the resonating frequency therefrom.

14. The system of claim 13, wherein the gas turbine engine system comprises a helicopter rotor-damper system and an engine.

15. The system of claim 14, wherein the system is part of a full authority digital engine control (FADEC) for managing operation of the engine.

16. The system of claim 13, wherein the bank of filters comprises adaptive filters, and the method comprises dynamically setting center frequencies of the bank of filters to maintain an overall range centered around the resonating frequency as detected.

* * * * *